(12) United States Patent
Chatterjee et al.

(10) Patent No.: US 7,216,310 B2
(45) Date of Patent: May 8, 2007

(54) DESIGN METHOD AND SYSTEM FOR OPTIMUM PERFORMANCE IN INTEGRATED CIRCUITS THAT USE POWER MANAGEMENT

(75) Inventors: Amitava Chatterjee, Plano, TX (US); David Barry Scott, Plano, TX (US); Theodore W. Houston, Richardson, TX (US); Song Zhao, Plano, TX (US); Shaoping Tang, Plano, TX (US); Zhiqiang Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 405 days.

(21) Appl. No.: 10/993,815

(22) Filed: Nov. 19, 2004

(65) Prior Publication Data

US 2005/0149887 A1     Jul. 7, 2005

Related U.S. Application Data

(60) Provisional application No. 60/534,723, filed on Jan. 7, 2004.

(51) Int. Cl.
*G06F 17/50* (2006.01)
*G11C 5/14* (2006.01)
*H03K 3/01* (2006.01)
*G05F 1/10* (2006.01)

(52) U.S. Cl. .............. 716/2; 716/1; 716/4; 365/189.08; 365/229; 327/534; 327/537

(58) Field of Classification Search .................. 716/1, 716/2; 438/216; 365/189.09, 226, 227, 365/229; 327/393, 534; 326/83, 84; 257/392, 257/776
See application file for complete search history.

(56) References Cited

U.S. PATENT DOCUMENTS 5,673,219 A * 9/1997 Hashimoto .................. 365/149

(Continued)

OTHER PUBLICATIONS

Tschanz et al., "Dynamic sleep transistor and body bias for active leakage power control of microprocessors", Nov. 2003, ☐☐Solid-State Circuits, IEEE Journal of, vol. 38, Issue 11, pp. 1838-1845.*

*Primary Examiner*—Jack Chiang
*Assistant Examiner*—Helen Rossoshek
(74) *Attorney, Agent, or Firm*—Peter K. McLarty; W. James Brady, III; Frederick J. Telecky, Jr.

(57) ABSTRACT

The present invention provides a method (100) of designing a circuit. The method comprises specifying (105) a design parameter for memory transistors and logic transistors and selecting (110) a test retention-mode bias voltage for the memory transistors. The method further comprises determining (115) a first relationship of a retention-mode leakage current and the design parameter at the test retention-mode bias voltage and obtaining (120) a second relationship of an active-mode drive current and the design parameter. The first and second relationships are used (125) to assess whether there is a range of values of the design parameter where the retention-mode leakage current and the active-mode drive current are within a predefined circuit specification. The method also includes adjusting (130) the test retention-mode bias voltage and repeating the determining and the using if the retention-mode total leakage current or the active-mode drive current is outside of the predefined circuit specification.

20 Claims, 2 Drawing Sheets

U.S. PATENT DOCUMENTS

| | | | |
|---|---|---|---|
| 5,883,841 A * | 3/1999 | Wendell | 365/190 |
| 6,021,063 A * | 2/2000 | Tai | 365/149 |
| 6,040,610 A * | 3/2000 | Noguchi et al. | 257/392 |
| 6,043,562 A * | 3/2000 | Keeth | 257/776 |
| 6,134,171 A * | 10/2000 | Yamagata et al. | 365/229 |
| 6,236,617 B1 * | 5/2001 | Hsu et al. | 365/230.06 |
| 6,341,087 B1 * | 1/2002 | Kunikiyo | 365/189.09 |
| 6,373,321 B1 * | 4/2002 | Yamauchi et al. | 327/534 |
| 6,476,641 B2 * | 11/2002 | Yoshida | 326/83 |
| 6,525,984 B2 * | 2/2003 | Yamagata et al. | 365/226 |
| 6,611,943 B2 * | 8/2003 | Shibata et al. | 716/1 |
| 6,700,826 B2 * | 3/2004 | Ito | 365/222 |
| 6,744,301 B1 * | 6/2004 | Tschanz et al. | 327/534 |
| 6,759,873 B2 * | 7/2004 | Kang et al. | 326/81 |
| 6,850,103 B2 * | 2/2005 | Ikeno et al. | 327/202 |
| 6,850,454 B2 * | 2/2005 | Kuge et al. | 365/227 |
| 6,873,561 B2 * | 3/2005 | Ooishi | 365/226 |
| 6,900,690 B2 * | 5/2005 | Kang et al. | 327/544 |
| 6,982,897 B2 * | 1/2006 | Luk et al. | 365/149 |
| 7,170,327 B2 * | 1/2007 | Aksamit | 327/202 |
| 2005/0128789 A1 * | 6/2005 | Houston | 365/154 |
| 2005/0224799 A1 * | 10/2005 | Yamamoto et al. | 257/66 |

* cited by examiner

DESIGN METHOD AND SYSTEM FOR OPTIMUM PERFORMANCE IN INTEGRATED CIRCUITS THAT USE POWER MANAGEMENT

CROSS-REFERENCE TO RELATED APPLICATIONS

This application claims the benefit of U.S. Provisional Application No. 60/534,723 entitled, "TRANSISTOR DESIGN METHODOLOGY FOR OPTIMUM PERFORMANCE IN INTEGRATED CIRCUITS THAT USE POWER MANAGEMENT," filed on Jan. 7, 2004, which is commonly assigned with the present invention, and incorporated by reference as if reproduced herein in its entirety.

TECHNICAL FIELD OF THE INVENTION

The present invention is directed, in general, to electronic circuits, and more particularly to designs for integrated circuits including transistors and to optimize power consumption while not sacrificing drive current capability in such circuits.

BACKGROUND OF THE INVENTION

Microelectronic devices have become prevalent in all aspects of electronic circuits, and the design of transistors used in such circuits typically takes into account various factors including layout area, power consumption, speed, and the like. Various computer-assisted design systems have arisen and many of these systems attempt to consider and optimize the above factors in developing circuit designs. The aim of these systems is to increase the efficiency of circuit design, and the systems themselves are periodically improved which may therefore also improve the circuit designs resulting from the system.

The increasing demand of electronic devices is driving the need to design circuits that provide increasingly higher transistor performance at low standby power. Moreover, as technology scales shrink, minimizing the leakage current associated with an increasing number of smaller-dimensioned memory transistors is expected to become increasingly important. The tradeoff between transistor leakage and drivability, however, limits the performance of conventional low-power technologies. Current conventional transistor design methodologies fail to address these concerns.

Accordingly, what is needed in the art is a transistor design methodology to optimize power management that reduces standby leakage current while maintaining high performance requirements.

SUMMARY OF THE INVENTION

To address the above-discussed deficiencies of the prior art, the present invention provides in one embodiment, a method of designing a circuit. The method comprises specifying a design parameter for memory transistors and logic transistors and selecting a test retention-mode bias voltage for the memory transistors. The method also comprises determining a first relationship of a retention-mode leakage current and the design parameter at the test retention-mode bias voltage. The method further includes obtaining a second relationship of an active-mode drive current and the design parameter. The method further uses the first and second relationships to assess whether there is a range of values of the design parameter where the retention-mode leakage current and the active-mode drive current are within a predefined circuit specification. Additionally, the method adjusts the test retention-mode bias voltage and repeats the determining and the using steps if the retention-mode total leakage current or the active-mode drive current is outside of the predefined circuit specification.

In another embodiment, the present invention provides a computer system for designing a circuit. The computer system comprises processing circuitry and storage circuitry for storing a plurality of files. The plurality of files comprises a program file and a circuit description file. The circuit description file comprises data describing a device in a circuit. The device comprises a plurality of transistors comprising memory and logic transistors wherein each of the transistors is defined by a design parameter. The processing circuitry is programmed in response to the program file to carry out the above-described method of designing the circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

The present invention recognizes for the first time that applying a bias voltage to memory transistors while in a standby or retention mode can impact the optimal design point for integrated circuits. The present invention benefits from the recognition that current leakage in a circuit can be greatly decreased by adjusting the design parameters for a particular retention-mode bias voltage applied to memory transistors of the circuit. This is in contrast to conventional circuit design flows, which do not consider the effect of retention-mode bias voltage on current leakage. Consequently, the present invention provides an improved circuit design methodology that allows the fabrication of high performance circuits with a lower standby power than obtainable for circuits fabricated using conventional designs.

Figure 1:
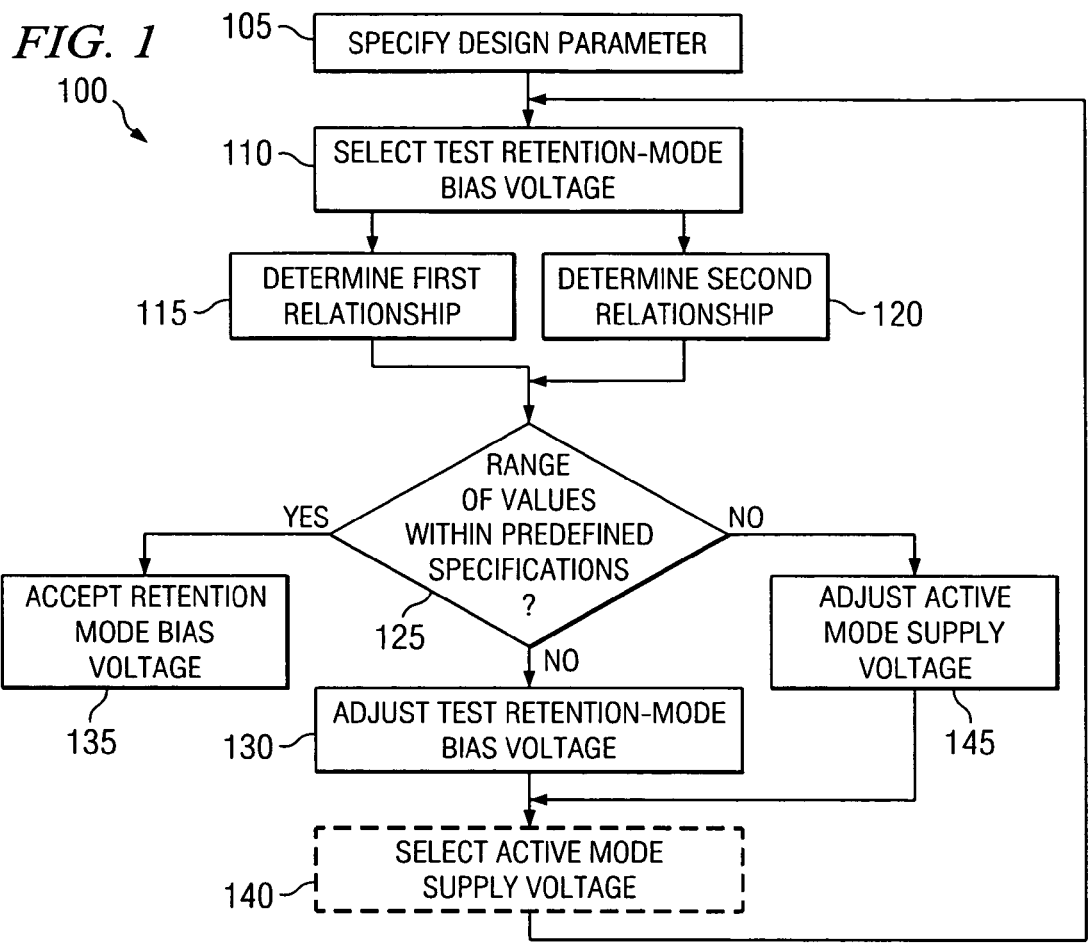
FIG. 1 illustrates by flow diagram, selected steps in a preferred embodiment of a method of designing a circuit following the principles of the present invention.

One embodiment of the present invention is a method of designing a circuit. FIG. 1 illustrates by flow diagram, selected steps in a preferred embodiment of the method 100. As illustrated in FIG. 1 the method includes, in step 105, specifying a design parameter for memory transistors and logic transistors. The term design parameter as used herein refers to any structural or physical attribute of the transistors of the integrated circuit. Non-limiting examples include: the dimensions of transistor components such as the gate, gate sidewall, source and drain, source/drain extension and semiconductor substrate; dopant type, implantation dose and dopant concentration in component parts of the transistors; and the magnitude and direction of strain imposed on the semiconductor substrate or other transistor components.

Preferred configurations of the logic and memory transistors are metal oxide semiconductor (MOS) transistors, such as P-type Metal Oxide Semiconductor (PMOS) or N-type Metal Oxide Semiconductor (NMOS) transistors. In some preferred configurations, the memory transistors are configured to form a static random access memory (SRAM) cell, such as a six-transistor SRAM cell. Of course the memory transistors can be configured to form other types SRAM memory cells, or other memory cells, well known to those of ordinary skill in the art.

In step 110, a test retention-mode bias voltage for the memory transistors is selected. The term retention-mode bias voltage refers to a voltage applied to one or more of the memory transistors when the circuit is in an off-state or stand-by-state. As well known by those skilled in the art, applying a retention-mode bias voltage can reduce the power needed for a memory cell to retain the information it contains. The designation of a test voltage is used here to indicate that the retention-mode bias voltage can be varied as part of optimizing the circuit's power management design. Thus, unlike conventional circuit design flows, the method 100 includes testing different values of retention-mode bias voltage to use in the circuit when it is in a standby-mode. The starting test retention-mode bias voltage is preferably selected based on experimental or theoretical evaluations of what bias voltage, or range of bias voltages, conducive to retaining information in the memory transistors.

For the particular test retention-mode bias voltage selected, the method 100 includes, in step 115, determining or obtaining a first relationship of a retention-mode leakage current and the design parameter. In some cases, the first relationship involves determining how a sum of leakage currents for the memory transistors changes as a function of the design parameter of interest. Of course, in some cases, it is not necessary to consider all sources contributing to the leakage current.

One skilled in the art would also understand how to tailor the determination of the first relationship in accordance to the transistors and design parameter of interest. This can include using conventional means to measure or calculate the various leakage components, and determine which contribute substantially to the transistor's current leakage when in a retention-mode. As an example, in some instances, it is sufficient to determine the relationship between the sum of an off-state sub-threshold leakage current plus a gate edge diode leakage current for the memory transistors, as a function of a design parameter. In other instances, it is desirable to consider the relationship between the off-state gate leakage current for the memory transistors and the transistor's design parameter, such as the gate oxide thickness or gate length.

The method 100 further includes, in step 120, obtaining or determining a second relationship of an active-mode drive current and the design parameter. Again, one of ordinary skill in the art would understand how to use conventional means to measure or calculate the drive current through the transistors, preferably the logic transistors, while in an active-mode or on-state.

In step 125, the first and second relationships are used to assess whether there is a range of values of the design parameter where both the retention-mode leakage current and the active-mode drive current are within a predefined circuit specification. As an example, the predefined circuit specification might require a certain maximum acceptable retention-mode leakage current that the memory transistors must be below. The predefined circuit specification might also require a specific minimum, or a range, of active-mode drive current that the logic transistor must be above, or fall within, respectively.

As further illustrated in FIG. 1, if the retention-mode total leakage current or the active-mode drive current is outside of the predefined circuit specification, then, in step 130, the test retention-mode bias voltage is adjusted and the step 115 of determining the first relationship is repeated at the adjusted value of the test retention-mode bias voltage. Then the step 115 of determining the first relationship and the step 125 of assessing are repeated. If the retention-mode leakage current and the active-mode drive current are within the predefined circuit specification, then in step 135, the test retention-mode bias voltage is accepted and the method 100 stops at this step 135.

In some embodiments, the method 100 further includes a step 140 of setting one or more an active mode supply voltages that are applied to the logic transistors. In step 145, the active mode supply voltage is changed if, after repeated iterations of steps 115, 120, 125 and 130, the retention-mode total leakage current or the active-mode drive current is outside of the predefined circuit specification. In such embodiments, after the changing the active-mode drive current in step 145, steps 110, 115, 120, 125, 130 are repeated. Of course, any of steps 110 to 130, 140 and 145 can be repeated multiple times before accepting a test retention mode bias voltage in step 135.

Although the method 100 presented in FIG. 1 has been discussed in the context of a single design parameter, one skilled in the art would readily recognize that the method of designing a circuit could include specifying a plurality of design parameters. Some preferred design parameters include, but are not limited to: the gate dimensions of one or both of the memory and logic transistors, the transistor's source/drain extension implantation dose (also known as the pocket halo dose), a super steep retrograde dopant dose for the memory and logic transistors, or a tensile nitride film for one or both of the memory and logic transistors. In such embodiments of the method, steps 110 to 130, as well as steps 140 and 145, can be repeated for each of the plurality of design parameters. One skilled in the art would be familiar with computational methods to alter the design parameters sequentially or in parallel to optimally obtain an acceptable retention mode bias voltage in accordance with step 135.

One skilled in the art would appreciate that the order of the above-described steps can be changed and additional steps added or other steps removed. For instance, the method 100 can be added to existing methods used in computer-assisted circuit designs, so that the considerations of existing methodologies can be enhanced by the considerations of the method 100.

Figure 2A:
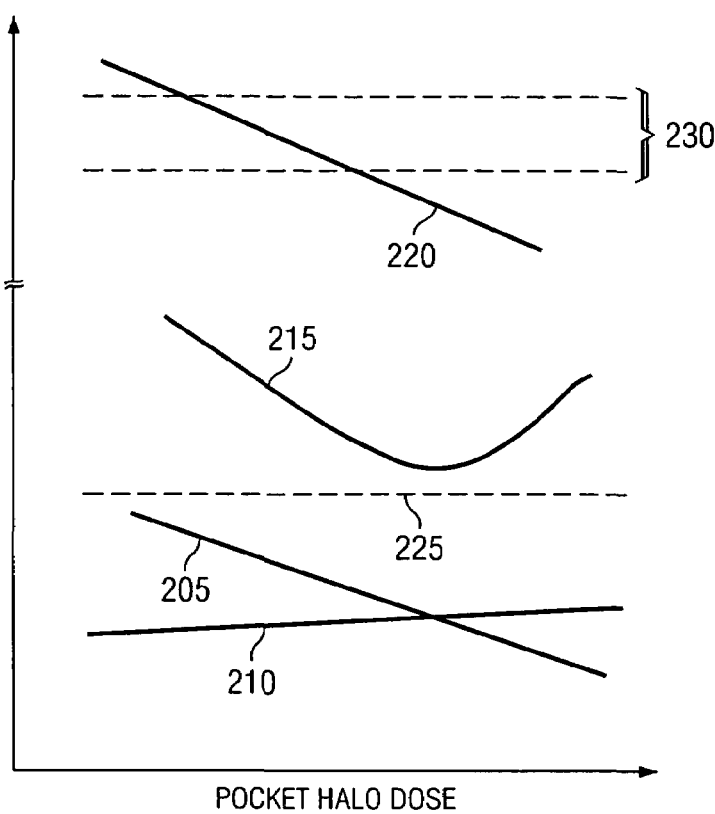
FIGS. 2A and 2B illustrate selected steps in a method of designing a circuit according to the principles of the present invention.
Figure 2B:
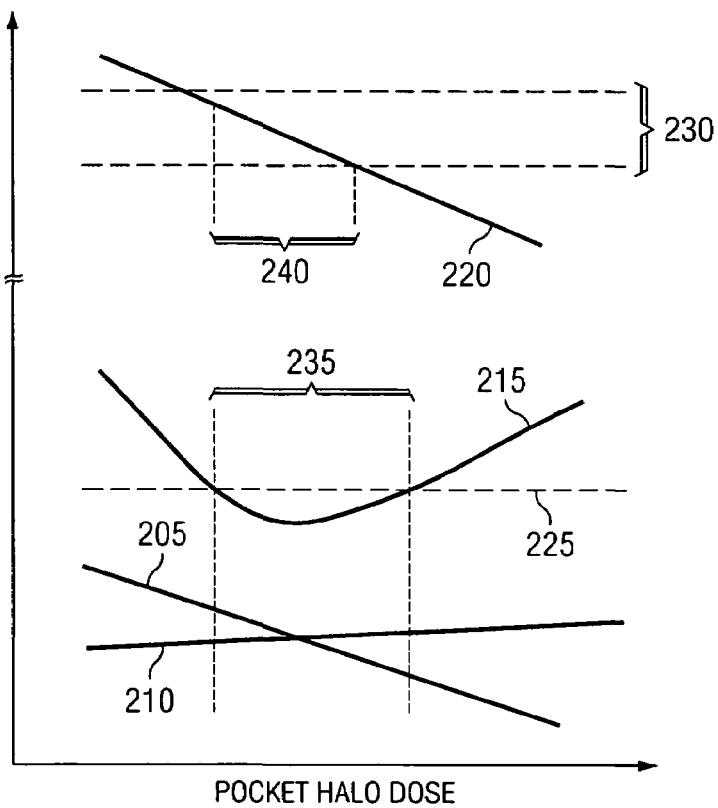

With continuing reference to FIG. 1, FIGS. 2A and 2B illustrate selected steps of an exemplary method 200 of designing a circuit according to the principles of the present invention. Turning first to FIG. 2A, illustrated is a graphical method of determining a first relationship, as per step 115. Shown is a plot 205 of the memory transistor's off-state sub-threshold leakage current versus a design parameter. In this case, the design parameter specified is a halo implantation dose for the memory and logic transistors, in accordance with step 105. Also shown in FIG. 2A is an exemplary plot 210 of the memory transistor's gate edge diode leakage current versus the halo implantation dose. These plots 205, 210 are at a test retention mode bias voltage, selected in accordance with step 110. A third plot 215 represents a sum of off-state current. Plot 215 corresponds to the sum of plot 205, the off-state sub-threshold leakage current, and plot 210, the gate edge diode leakage current. For the embodiment shown in FIG. 2A, the determination of plot 215 represents determining the first relationship in step 115.

Further shown in FIG. 2A is an exemplary graphical method of obtaining a second relationship, as per step 120 in FIG. 1. Shown is plot 220, corresponding to the active-mode drive current for the logic transistors as a function of the design parameter. Also illustrated in FIG. 2A is a predefined circuit specification, which in this embodiment corresponds to a maximum acceptable leakage current 225 for the memory transistors in retention mode. The predefined circuit specification also sets forth a range 230 of acceptable drive current for the logic transistors in active mode. The first and second relationships, exemplified as plots 215 and 220, respectively, can be used, as per step 125, to determine whether there is a range of values of the design parameter within the predefined circuit specification. For the exemplary conditions shown in FIG. 2A, plot 215 reveals that there is no range of values of halo pocket dose at which the sum of off-state leakage current is below the maximum acceptable leakage current 225.

FIG. 2B shows the plots 215 and 220 after adjusting the test retention mode bias voltage, analogous to step 130 in FIG. 1. In the particular embodiment shown in FIG. 2B, plot 215 has changed, as compared to FIG. 2B, while plot 220 is unaltered. Plot 215 has changed mostly because plot 205, the relationship between off-state sub-threshold leakage current versus halo implant dose, is substantially different for the adjusted the test retention mode bias voltage than depicted for the test retention mode bias voltage used in FIG. 2A.

At the adjusted test retention mode bias voltage, the first relationship, shown in plot 215, reveals that there is now a range 235 of values of halo pocket dose at which the sum of off-state currents is below the maximum acceptable leakage current 225. Moreover, plot 220 shows that there is also an overlapping range 240 of halo pocket dose at which the active-mode drive current is within the range 230 of acceptable drive current for the logic transistors. Therefore the adjusted test retention mode bias voltage selected, corresponding to FIG. 2B, is accepted, as per step 135.

Of course, non-graphical procedures, such as computerized programs can be used to facilitate determining or observing the first and second relationships. Such programs can also use these relationships to determine whether there is a range of values of the design parameter for a given test retention-mode bias voltage that provide leakage and drive currents within the predefined circuit specification.

Figure 3:
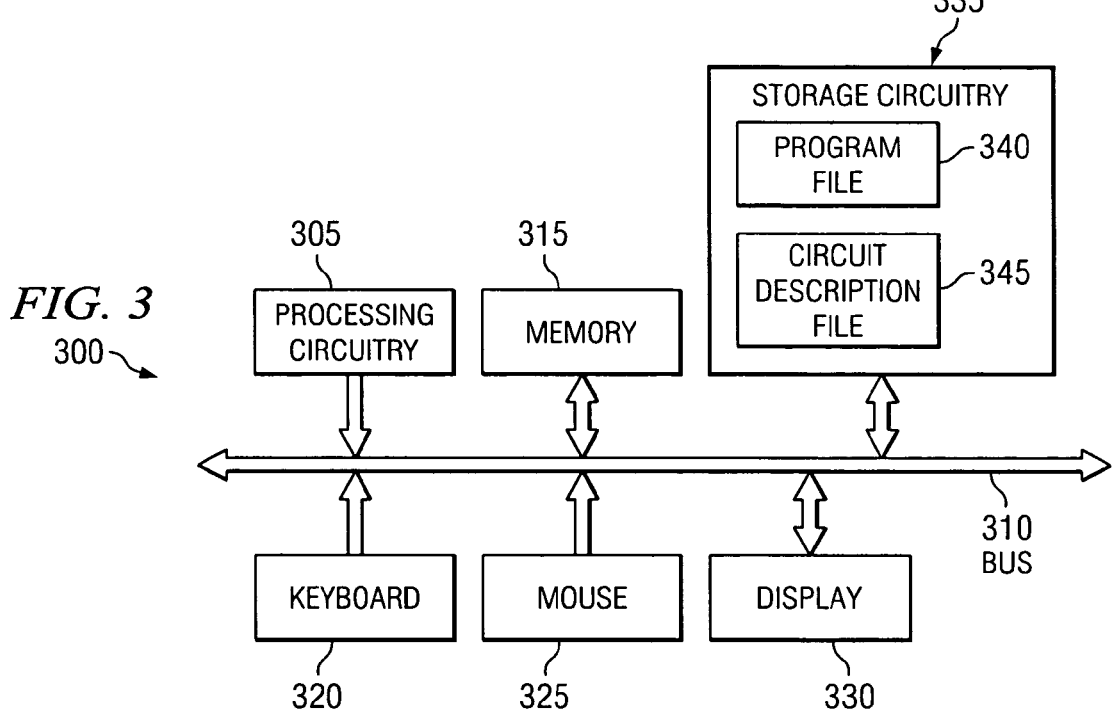
FIG. 3 presents a block diagram of a preferred embodiment of a computer system for designing a circuit according to the principles of the present invention.

Another aspect of the present invention is a computer system. FIG. 3 presents a block diagram of a preferred embodiment of a computer system 300 for designing a circuit according to the principles of the present invention. The computer system 300 can comprise any conventional processing device capable of performing operations needed for circuit design, and include components well known to those skilled in the art. The computer system 300 including processing circuitry 305, such as a CPU, or other single or multiple processors. As illustrated in FIG. 3, the processing circuitry 305 can be coupled, via a bus 310, to a memory 315 capable of storing various types of data. The computer system 300 can further comprise one or more input/output devices, such as a keyboard 320, a mouse 325, and a video display 330.

The computer system 300 further comprises storage circuitry 335. The storage circuitry 335 can include various peripheral devices well known to one skilled in the art for storing and providing data. The storage circuitry 335 can comprise a floppy disk drive, a hard disk drive, a CD ROM drive, or optical drive, for example.

The storage circuitry 335 stores a plurality of files, including a program file 340, and a circuit description file 345. Various program languages may be used for the program file 340. The circuit description file 345 comprises data describing a device in a circuit. The device comprises a plurality of transistors comprising memory and logic transistors. Each of the transistors is defined by one or a plurality of design parameters as discussed above. The circuit description file 345 can further comprise additional information about the circuit including resistors, capacitors, inductors, device connections, signals, and predefined specifications for the current performance and leakage characteristics for components of the circuit.

The computer system 300 is programmed to design circuits by applying the program file 340, to the circuit description file 345. Information in the program file 340 and the circuit description file 345 is loaded into the memory 315, or other memory (e.g., within the processing circuitry 305). The processing circuitry 305 is programmed in response to the program file 340 to perform various circuit design operations, such as the steps of the method presented in FIG. 1.

Although the present invention has been described in detail, those skilled in the art should understand that they can make various changes, substitutions and alterations herein without departing from the scope of the invention in its broadest form.

What is claimed is:

1. A method of designing a circuit, comprising:

specifying a design parameter for memory transistors and logic transistors;

selecting a test retention-mode bias voltage for said memory transistors;

determining a first relationship of a retention-mode leakage current and said design parameter at said test retention-mode bias voltage;

obtaining a second relationship of an active-mode drive current and said design parameter;

using said first and second relationships to assess whether there is a range of values of said design parameter where said retention-mode leakage current and said active-mode drive current are within a predefined circuit specification; and adjusting said test retention-mode bias voltage and repeating said determining and said using if said retention-mode total leakage current or said active-mode drive current is outside of said predefined circuit specification.

2. The method recited in claim 1, further including accepting said test retention-mode bias voltage when said retention-mode leakage current and said active-mode drive current are within said predefined circuit specification.

3. The method recited in claim 1, wherein determining said first relationship includes determining a sum of an off-state sub-threshold leakage current and a gate edge diode leakage current for said memory transistors.

4. The method recited in claim 1, wherein determining said first relationship includes determining an off-state gate leakage current for said memory transistors.

5. The method recited in claim 1, wherein a plurality of design parameters for said memory and said logic transistors are specified and said selecting, said determining, said obtaining and said adjusting are repeated for each of said plurality of design parameters.

6. The method recited in claim 1, wherein said memory transistors are configured to form a six-transistor memory cell.

7. The method recited in claim 1, further includes setting an active mode supply voltage applied to said logic transistors, and changing said active mode supply voltage if said retention-mode total leakage current or said active-mode drive current is outside of said predefined circuit specification.

8. The method recited in claim 7, wherein said selecting, said determining, said obtaining and said using are repeated after said changing until said retention-mode leakage current and said active-mode drive current are within said predefined circuit specification.

9. The method recited in claim 1, wherein said design parameter comprises gate dimensions of one or both of said memory transistors and said logic transistors.

10. The method recited in claim 1, wherein said design parameter comprises a pocket halo dose for said memory transistors and said logic transistors.

11. The method recited in claim 1, wherein said design parameter comprises a super steep retrograde dopant dose for said memory transistors and said logic transistors.

12. The method recited in claim 1, wherein said design parameter comprises a tensile nitride film for one or both of said memory transistors and said logic transistors.

13. A computer system for designing a circuit, comprising:
processing circuitry; and
storage circuitry for storing a plurality of files, said plurality of files comprising:
a circuit description file comprising data describing a device in a circuit,
wherein said device comprises a plurality of transistors comprising memory and logic transistors and wherein each of said transistors is defined by a design parameter; and
a program file;
wherein said processing circuitry is programmed in response to said program file to:
specify a test retention-mode bias voltage for said memory transistors;
determine a first relationship of a retention-mode leakage current and said design parameter at said test retention-mode bias voltage;
obtain a second relationship of an active-mode drive current and said design parameter;
use said first and second relationships to assess whether there is a range of values of said design parameter where said retention-mode leakage current and said active-mode drive current are within a predefined circuit specification; and
adjust said test retention-mode bias voltage and repeat said determination and said use if said retention-mode total leakage current or said active-mode drive current is outside of said predefined circuit specification.

14. The computer system recited in claim 13, wherein said processing circuitry is programmed in response to said program file to accept said test retention-mode bias voltage when said retention-mode total leakage current and said active-mode drive current are within said predefined circuit specification.

15. The computer system recited in claim 13, wherein determining said first relationship includes determining a sum of an off-state sub-threshold leakage current and a gate edge diode leakage for said memory transistors.

16. The computer system recited in claim 13, wherein determining said first relationship includes determining an off-state gate leakage current for said memory transistors.

17. The computer system recited in claim 13, wherein each of said transistors is defined by a plurality of design parameters for said memory and said logic transistors.

18. The computer system recited in claim 13, wherein said plurality of design parameters are specified and said specifying, said determining, said obtaining, said using and said adjusting are repeated for each of said plurality of design parameters.

19. The computer system recited in claim 13, wherein said memory transistors are configured to form a static random access memory (SRAM) cell.

20. The computer system recited in claim 13, wherein said memory transistors are configured to form a six-transistor SRAM cell.

* * * * *